United States Patent
Kao et al.

(10) Patent No.: US 7,560,355 B2
(45) Date of Patent: Jul. 14, 2009

(54) SEMICONDUCTOR WAFER SUITABLE FOR FORMING A SEMICONDUCTOR JUNCTION DIODE DEVICE AND METHOD OF FORMING SAME

(75) Inventors: Lung-Ching Kao, Taipei (TW); Pu-Ju Kung, Taipei (TW)

(73) Assignee: Vishay General Semiconductor LLC, Hauppauge, NY (US)

( * ) Notice: Subject to any disclaimer, the term of this patent is extended or adjusted under 35 U.S.C. 154(b) by 124 days.

(21) Appl. No.: 11/585,469

(22) Filed: Oct. 24, 2006

(65) Prior Publication Data

US 2008/0096360 A1   Apr. 24, 2008

(51) Int. Cl.
 *H01L 21/8222* (2006.01)
(52) U.S. Cl. .................. 438/328; 257/183; 257/191
(58) Field of Classification Search ............. 438/328; 257/183, 191
See application file for complete search history.

(56) References Cited

U.S. PATENT DOCUMENTS

| | | | |
|---|---|---|---|
| 4,967,256 A | 10/1990 | Pathak et al. ................ 357/38 |
| 5,516,705 A | 5/1996 | Webb et al. .................... 437/6 |
| 6,238,482 B1 | 5/2001 | Doyle et al. ................. 117/108 |
| 6,458,205 B1 | 10/2002 | Hasegawa et al. ............. 117/90 |
| 6,632,278 B2 | 10/2003 | Falster et al. ................. 117/84 |
| 6,727,525 B1 * | 4/2004 | Goerlach ..................... 257/107 |
| 6,818,197 B2 | 11/2004 | Ikezawa et al. .......... 423/328.2 |
| 6,878,451 B2 | 4/2005 | Asayama et al. ............. 428/446 |

OTHER PUBLICATIONS

Solid State Electronic Devices 5$^{TH}$ Edition; B. Streetman et al.; Pearson Education, Inc. 2004.

* cited by examiner

*Primary Examiner*—Douglas M Menz
(74) *Attorney, Agent, or Firm*—Mayer & Williams PC; Stuart H. Mayer, Esq.; Karin L. Williams, Esq.

(57) ABSTRACT

A method is provided of making a semiconductor wafer for a semiconductor junction diode device having a target forward voltage drop and a target reverse breakdown voltage. The method begins by doping a semiconductor substrate of a first conductivity type through the back surface with a first dopant of the first conductivity type in an amount sufficient to form a semiconductor junction diode device having a target forward voltage drop. Next, the substrate is doped through the front surface with a second dopant of the first conductivity type in an amount sufficient to form the semiconductor junction diode device such that it has a target reverse breakdown voltage.

20 Claims, 2 Drawing Sheets

SEMICONDUCTOR WAFER SUITABLE FOR FORMING A SEMICONDUCTOR JUNCTION DIODE DEVICE AND METHOD OF FORMING SAME

FIELD OF THE INVENTION

The present invention is related to semiconductor fabrication. More specifically the present invention is related to fabrication of near epitaxial (EPI) quality wafers.

BACKGROUND OF THE INVENTION

Epitaxial (EPI) quality wafers (hereinafter referred to as "EPI wafers") are well-known in the art. The term "epitaxial" is defined as the growth of a single-crystal semiconductor film upon a single-crystal substrate. An epitaxial layer has the same crystallographic characteristics as the substrate material. The single-crystalline epitaxial structure comes about when silicon atoms are deposited on a bare silicon wafer in a Chemical Vapor Deposition ("CVD") reactor. When chemical reactants are controlled and the system parameters are set correctly, the depositing atoms arrive at the wafer surface with sufficient energy to move around on the surface and orient themselves to the crystal arrangement of the wafer atoms.

EPI wafers typically include a heavily doped silicon substrate that provides a very low resistance (typically lower than about 0.001 ohm-sq) and an EPI layer of approximately 1 to 3 microns that is epitaxially grown on the substrate. FIG. 1 illustrates a cross sectional view through an EPI wafer 100 onto which a semiconductor junction diode device can be built. The EPI wafer includes silicon substrate 102 and EPI layer 104. Such devices can be employed to suppress transients of high voltage in a power supply or the like before the transients reach and potentially damage an integrated circuit or similar structure.

One advantage that arises from the use of an EPI wafer to form a semiconductor junction diode device such as depicted in FIG. 1 is that its reverse breakdown voltage, VB, is largely controlled by the dopant concentration of the EPI layer 104, whereas the forward voltage drop of the device is determined by the overall series resistance of the EPI wafer. The overall series resistance of the EPI wafer is in turn largely determined by the resistance of the substrate 102. Since the substrate 102 of an EPI wafer typically has a low resistance, the forward voltage drop of the device can generally be kept desirably low. If on the other hand a non-EPI wafer were employed, the forward voltage would generally be greater since it is difficult to provide non-EPI wafers with a relatively low overall series resistance.

While EPI wafers present the advantage explained above, EPI wafers are very costly. Conventional EPI wafers may run up to approximately $50.00 or more per wafer. Moreover, while several methods have been proposed to obtain EPI wafers at a cheaper cost, the proposed methods are generally limited in some way. For example, less expensive methods can only provide EPI layers that have thicknesses less than 1 micrometer. EPI layers having thicknesses of less than 1 micrometer cause devices (e.g., diodes, transistors) that may be fabricated onto these layers to be limited in performance as these transistors have relatively large junction capacitances. The large junction capacitances primarily arise because since the EPI layer is thin, the junction capacitances extend in the heavily doped substrate.

Accordingly, it would be desirable to provide a relatively inexpensive semiconductor wafer that can be used instead of an EPI wafer to form semiconductor devices with a forward voltage drop and a reverse breakdown voltage that can be tailored within a wide range of values.

SUMMARY OF THE INVENTION

In accordance with the present invention, a method is provided of making a semiconductor wafer for a semiconductor junction diode device having a target forward voltage drop and a target reverse breakdown voltage. The method begins by doping a semiconductor substrate of a first conductivity type through the back surface with a first dopant of the first conductivity type in an amount sufficient to form a semiconductor junction diode device having a target forward voltage drop. Next, the substrate is doped through the front surface with a second dopant of the first conductivity type in an amount sufficient to form the semiconductor junction diode device such that it has a target reverse breakdown voltage.

In accordance with another aspect of the invention, at least one of the doping steps includes implanting and diffusing the first dopant.

In accordance with another aspect of the invention, the semiconductor substrate is a non-EPI substrate In accordance with another aspect of the invention, the semiconductor substrate is a Si substrate.

In accordance with another aspect of the invention, the non-EPI substrate has a resisistivity greater than about 20 ohm-sq.

In accordance with another aspect of the invention, the step of doping the substrate through the back surface forms a first diffusion layer that is greater in thickness than a second diffusion layer formed by the step of doping the substrate through the front surface.

In accordance with another aspect of the invention, the thickness of the first diffusion layer is between about 200-250 microns.

In accordance with another aspect of the invention, the second diffusion layer has a thickness of less than about 50 microns.

In accordance with another aspect of the invention, the steps of doping the substrate through front and back surfaces forms first and second diffusion layers, respectively, wherein the second diffusion layer has a maximum conductivity that is greater than a maximum conductivity of the first diffusion layer.

DETAILED DESCRIPTION

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art.

The present inventors have recognized that the forward voltage drop of a semiconductor junction diode device can be improved (i.e., reduced) without the use of a relatively expensive EPI wafer. Instead of an EPI wafer, as described in more detail below, a less expensive, polished non-EPI wafer that undergoes two diffusion processes may be used.

Figure 1:
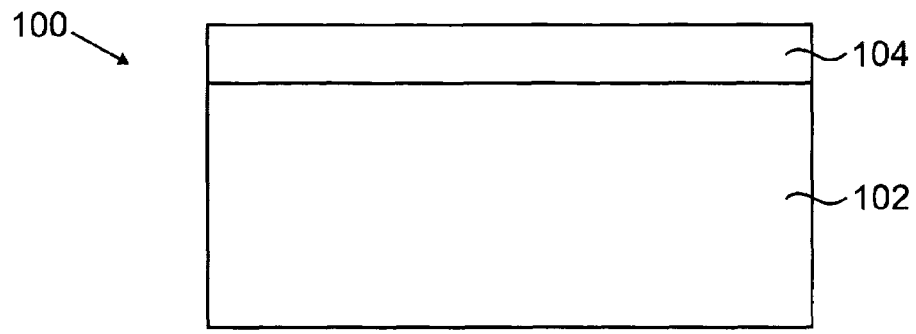
FIG. 1 illustrates a cross sectional view through an EPI wafer onto which a semiconductor junction diode device can be built.
Figure 2:
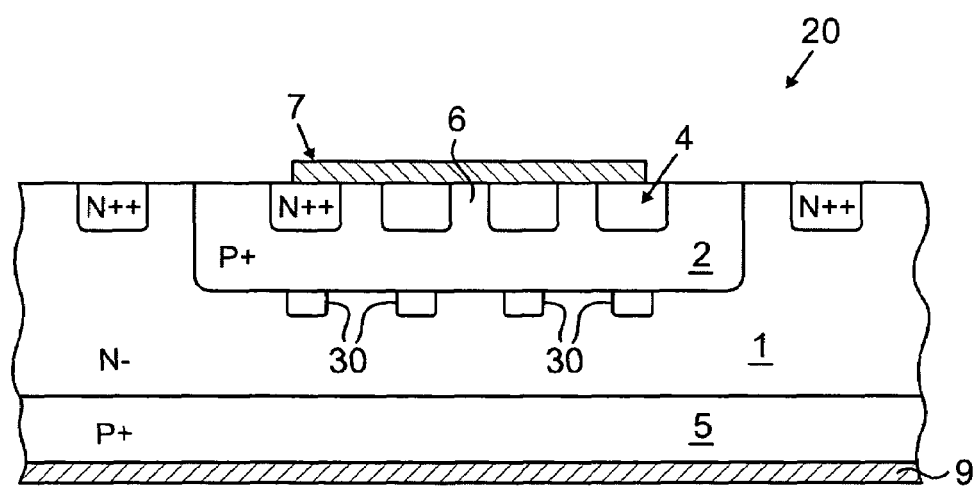
FIG. 2 shows one example of a semiconductor junction diode device that may be formed in the wafer described herein.

FIG. 2 shows one example of a semiconductor junction diode device (e.g., zener diode, thyrister) that may be formed in the wafer described herein. The device 20 includes metal contacts 7 and 9, an upper base region 2 having a cathode or emitter region 4 separated by shorting dots 6. The upper base 2 is P+-type conductivity while the emitter regions 4 are N++-type conductivity. The shorting dots 6 are P+-type conductivity like the upper base region 2. The emitter region 4 and the shorting dots 6 are coupled to the metal contact 7. Upper base 2 and emitter region 4 are formed by implantation and diffusion into a substrate 1 of N--type conductivity. A lower base or anode region 5 is formed on a lower surface of substrate 1 and is in contact with the metal contact 9. The lower base region is P+-type conductivity.

The P-type dopants (e.g., boron) add positive charges to the semiconductor material, while the N-type dopants (e.g., phosphorus) add negative charges to the semiconductor materials. Preferably, the P++ or N++ concentration approximately encompasses the range of $1 \times 10^{19}$ to $1 \times 10^{21}$ atoms/$cm^3$ and the P+ and N+ concentration approximately encompasses the range of $1 \times 10^{15}$ to $1 \times 10^{20}$ atoms/$cm^3$. The P- to P (or N- to N) range of dopant concentration approximately encompasses the range of $1 \times 10^{14}$ to $1 \times 10^{16}$ atoms/$cm^3$. The concentration in the regions may vary depending on what depth of the region is examined. Thus, these concentrations are provided only in approximate ranges.

Figure 3:
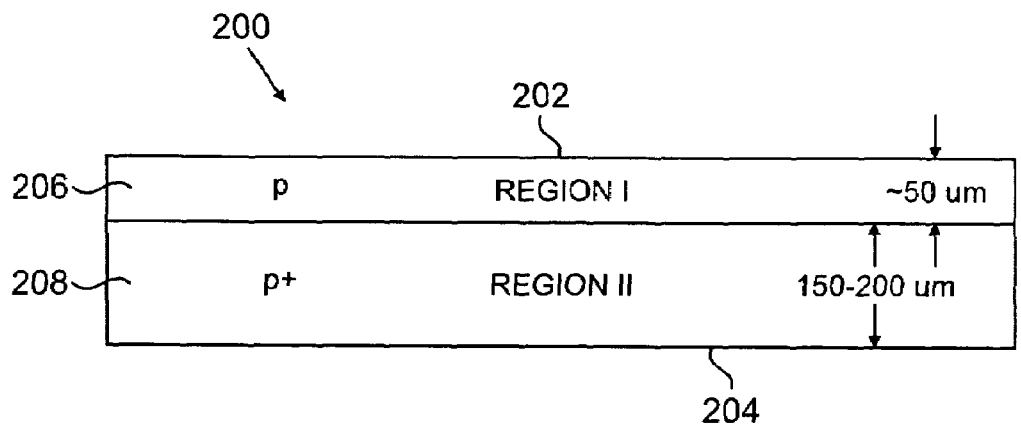
FIG. 3 shows one example of a starting wafer that may be employed in the present invention to fabricate a semiconductor junction device such as illustrated in FIG. 2.

FIG. 3 shows one example of a starting wafer 200 that may be employed in the present invention to fabricate a semiconductor junction device such as illustrated in FIG. 2. The starting wafer 200 is a commercially available high resistance (e.g., greater than 20 ohm-sq) non-EPI Si wafer. The starting wafer may be either n-type or p-type, depending on the resulting device that is to be fabricated. The front side 202 of the wafer is generally polished to facilitate subsequent fabrication of the junction device.

To reduce the overall resistance of the wafer 200 so that the forward voltage drop can be reduced, an implantation and diffusion process is employed to drive in a dopant into the backside 204 of the wafer 200. The dopant that is employed has the same conductivity as the starting wafer 200. That is, if the starting wafer 200 is initially n-type an n-type dopant is employed and if a p-type starting wafer 200 is employed a p-type dopant is employed in the diffusion process. To drive in the dopant as far as possible into the backside 204 of the wafer 200 a relatively long diffusion process at high diffusion temperatures can be employed. Still, practically speaking, if commonly employed dopant diffusion processes are used, the drive in depth will generally fall between about 200 and 250 microns to provide a low resistivity region 208 (Region II). Thus, if the starting wafer 200 is initially about 250 microns thick and the drive in depth is 200 microns, then a high resistivity region 206 (Region I) will remain, which has a thickness of about 50 microns. The overall thickness of the wafer 200 is therefore limited by the diffusion depth of the dopant through the backside 204 of the wafer 200. Of course, if other implantation and/or diffusion techniques are employed that can drive in dopants by a greater amount, thicker wafers may be employed.

Figure 4:
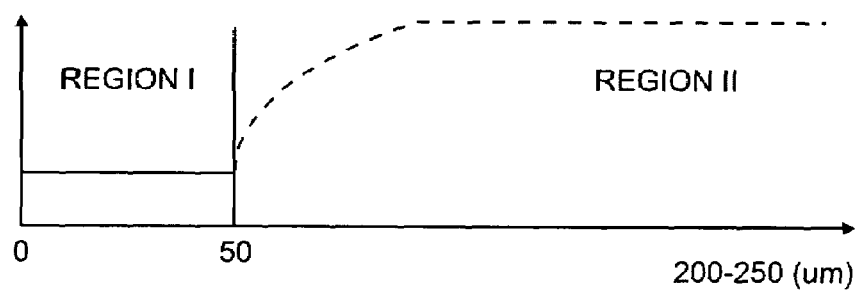
FIG. 4 shows the dopant concentration profile after implantation and diffusion through the backside of the wafer.

After performing the implantation and diffusion process described above, the wafer 202 has a thin p layer 206 formed on a thicker p+ layer 208 (or, alternatively, n/n+ layers 206 and 208). This resulting dopant concentration profile is shown in FIG. 4. The thicker high concentration layer 208 allows a junction device to be formed with a relatively low forward voltage drop. However, for reasons explained below, the thin, lower concentration layer 206, in which the upper base 2 and emitter regions 4 of the FIG. 2 device can be formed, is generally only suitable for junction devices with a relatively high breakdown voltage (e.g., greater than about 600 V), not for junction devices with lower breakdown voltages (e.g., voltages less than about 600V).

The relationship between the breakdown voltage and dopant concentration can be determined from a consideration of a simple PN junction having a width W0. Without being bound to any particular theory or model, the following analysis is presented to facilitate an understanding of the present invention. As discussed, for example, in chapter 5 of *Solid State Electronic Devices*, $5^{th}$ Edition, B. Streeman et al., Pearson Education, Inc., 2004, the contact potential $V_o$ across a pn junction of width $W_0$ can be expressed as:

$$V_0 = \frac{1}{2} \cdot |\varepsilon_0| \cdot W_0$$

where $\varepsilon_0$ is the electric field across the junction.

The breakdown voltage $V_B$ that arises under a certain critical electrical field $\varepsilon_C$ thus can be expressed as $$V_B = \frac{1}{2} \cdot |\varepsilon_c| \cdot W_B$$

where $W_B$ is the depletion width at device breakdown and $W_B > W_0$

As shown in Eq. (5-22) of *Solid State Electronic Devices* the equilibrium width $W_0$ of the junction can be expressed as $$W_0 = \left[\frac{2 \in V_0}{q}\left(\frac{1}{N_a} + \frac{1}{N_b}\right)\right]^{\frac{1}{2}}$$

and thus $$W_B = \left[\frac{2 \in V_B}{q}\left(\frac{1}{N_a} + \frac{1}{N_d}\right)\right]^{\frac{1}{2}}$$

where $N_a$ and $N_d$ are the doping concentrations of acceptor ions and donor ions, respectively.

Accordingly, $V_B$ can be expressed as:

$$V_B = \frac{\in \varepsilon_c^2}{2q}\left(\frac{N_a + N_d}{N_a N_d}\right)$$

In the case of a one sided abrupt junction in which one side is more heavily doped (e.g., $P^+N$) $N_a >> N_d$ then VB can be well approximated by the following equation:

$$V_B \approx \frac{\in \varepsilon_c^2}{2q}(N_d)^{-1}$$

In the present invention the pn junction is defined by the thin, more lightly doped layer 206 and the more heavily doped thicker layer 208. Accordingly, $N_d$ represents the doping concentration of donor ions in the layer 208, which may therefore be referred to as the bulk concentration of the wafer.

Figure 5:
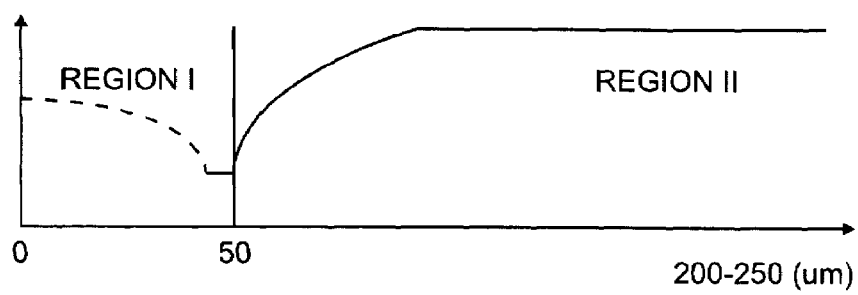
FIG. 5 shows the dopant concentration profile of the wafer after both implantation and diffusion processes have been performed through the front and back sides of the wafer.

As the preceding equation indicates, since layer 206 has a relatively low dopant concentration, the breakdown voltage of the resulting junction device will be relatively large. To produce a junction device with a lower breakdown voltage, the dopant concentration of layer 206 should therefore be increased. This can be accomplished with a second implantation and diffusion process through the front side 202 of wafer 200. The dopant that is introduced through the front side 202 of wafer 200 will have the same conductivity as the starting wafer 200. The dopant concentration profile of the wafer 200 after both implantation and diffusion processes have been performed through the front and back sides of the wafer 200 is shown in FIG. 5. After the second implantation and diffusion process is performed, the higher dopant concentration of layer 206 allows a junction device with a lower reverse breakdown voltage to be formed.

By controlling the precise dopant concentration of layer 206 in the manner described above, the reverse breakdown voltage of the resulting device can be tailored as desired. Moreover, by controlling the overall dopant concentration profile of the starting wafer 200 (that is, by controlling the overall dopant concentration of layer 208 as well as layer 206) in the manner described above, the reverse breakdown voltage can be tailored while also achieving a low forward voltage drop. The particular dopant concentration profile needed to fabricate a device with some desired target reverse breakdown voltage and forward voltage drop can be determined by techniques such as simulations and the like that are well known to those of ordinary skill in the art. Likewise, appropriate dopants, dopant concentrations and doping parameters (e.g., implantation energy, diffusion times and temperatures) are well known to those of ordinary skill in the art.

EXAMPLE

Semiconductor junction diode devices were formed on a polished wafer, the inventive wafer (a polished wafer undergoing the doping processes described above) and an Epi wafer. All the wafers had similar reverse voltage performances (VR~88V). All three wafers were 200 um thick and had n-type conductivity. The polished wafer had a resistivity of 0.45 ohm-sq. Boron oxide was deposited on its surface and underwent a drive-in for 900 minutes. The inventive wafer began with a starting substrate having a resistivity of 20 ohm-sq. Phosphorus oxide was deposited on its back surface and underwent a drive-in for 6000 minutes. Phosphorus was implanted on the front, polished surface with a dosage of $5.0 \times 10^4$ and underwent a drive-in for 4500 minutes. Finally, boron oxide was deposited on its surface and underwent a drive-in for 900 minutes. The EPI Wafer began with an N+ substrate 150 microns thick with a resistivity of 0.005 ohm-sq resistivity. A 50 micron, $3.0 \times 10^{14}$ ea/cc EPI layer was formed on the substrate by depositing boron oxide on its surface and underwent a drive-in for 900 minutes.

The reverse voltage performances of all the devices formed on the three wafers were similar and around 80 volts. But the forward voltage drop of both the Epi wafer and the inventive wafer were much better than the polished wafer. In particular, the EPI wafer had a VF of 1.28V, the inventive wafer had a VF of 1.395V and the polished wafer had a VF of 2.985V at a constant current density of $4.0 \times 10^{-4}$ A/um. Simulations suggest that at higher current densities a device formed on the inventive wafer may even have superior forward voltage performance.

The invention claimed is:

1. A method of making a semiconductor wafer for a semiconductor junction diode device having a target forward voltage drop and a target reverse breakdown voltage, comprising:
    providing a semiconductor substrate of a first conductivity type, said substrate having a front surface and a back surface;
    a first doping step of doping the substrate through the back surface with a first dopant of the first conductivity type in an amount sufficient to form a semiconductor junction diode device having a target forward voltage drop, wherein a first diffusion layer formed by said first doping step has a dopant concentration with a first dopant profile that is either constant or decreasing with increasing depth through the back surface of the substrate; and
    a second doping step of doping the substrate through the front surface with a second dopant of the first conductivity type in an amount sufficient to form the semiconductor junction diode device such that it has a target reverse breakdown voltage, wherein a second diffusion layer formed by said second doping step has a dopant concentration with a second dopant profile that is either constant or decreasing with increasing depth through the front surface of the substrate.

2. The method of claim 1 wherein at least one of the first and second doping steps include implanting and diffusing the first dopant.

3. The method of claim 1 wherein the semiconductor substrate is a non-EPI substrate.

4. The method of claim 3 wherein the semiconductor substrate is a Si substrate.

5. The method of claim 2 wherein the non-EPI substrate has a resistivity greater than about 20 ohm-sq.

6. The method of claim 1 wherein the first doping step of doping the substrate through the back surface forms a first diffusion layer that is greater in thickness than a second diffusion layer formed by the second doping step of doping the substrate through the front surface.

7. The method of claim 6 wherein the thickness of the first diffusion layer is between about 200-250 microns.

8. The method of claim 1 wherein the substrate has a thickness between about 200-250 microns.

9. he method of claim 6 wherein the substrate has a thickness between about 200-250 microns.

10. The method of claim 9 wherein the second diffusion layer has a thickness of less than about 50 microns.

11. The method of claim 1 wherein the second and first doping steps of doping the substrate through front and back surfaces, respectively, forms first and second diffusion layers, respectively, wherein the second diffusion layer has a maximum conductivity that is greater than a maximum conductivity of the first diffusion layer.

12. A semiconductor wafer, comprising:
    a semiconductor substrate of a first conductivity type having front and back surfaces;

a first diffusion layer of the first conductivity type formed in the substrate and having a dopant concentration with a first dopant profile that is either constant or decreasing with increasing depth through the back surface of the substrate;

a second diffusion layer of the first conductivity type formed in the substrate and having a dopant concentration with a second dopant profile that is either constant or decreasing with increasing depth through the front surface of the substrate.

13. The semiconductor wafer of claim 12 wherein the semiconductor substrate is a non-EPI substrate.

14. The semiconductor wafer of claim 13 wherein the semiconductor substrate is a Si substrate.

15. The semiconductor wafer of claim 13 wherein the non-EPI substrate has a resistivity greater than about 20 ohm-sq.

16. The semiconductor wafer of claim 12 wherein the first diffusion layer is greater in thickness than the second diffusion layer.

17. The semiconductor wafer of claim 16 wherein the thickness of the first diffusion layer is between about 200-250 microns.

18. The semiconductor wafer of claim 12 wherein the semiconductor substrate has a thickness between about 200-250 microns.

19. The semiconductor wafer of claim 17 wherein the second diffusion layer has a thickness of less than about 50 microns.

20. The semiconductor wafer of claim 1 wherein the second diffusion layer has a maximum conductivity that is greater than a maximum conductivity of the first diffusion layer.

* * * * *

UNITED STATES PATENT AND TRADEMARK OFFICE
CERTIFICATE OF CORRECTION

PATENT NO. : 7,560,355 B2
APPLICATION NO. : 11/585469
DATED : July 14, 2009
INVENTOR(S) : Kao et al.

It is certified that error appears in the above-identified patent and that said Letters Patent is hereby corrected as shown below:

Col. 1, line 63, after "capacitances", change "primarly" to -- primarily --.

Col. 1, line 63, after "because", change "since" to -- if --.

Col 2, line 23, after "non-EPI substrate", add -- . --.

Col. 2, line 53, after "formed", change "in" to -- on --.

Col. 3, line 16, before "the wafer", change "in" to -- on --.

Col, 3, line 45, change "n-type or p-type," to -- N-type or P-type, --.

Col. 3, line 51, after "drive", delete "in".

Col. 3, line 54, after "initially", change "n-type an n-type" to -- N-type, an N-type --.

Col. 3, line 55, after "if a", change "p-type" to -- P-type --.

Col. 3, line 55, after "employed", add -- , --.

Col. 3, line 56, before "dopant", change "p-type" to -- P-type --.

Col. 3, line 57, before "the dopant", delete "in".

Col. 3, line 58, after "wafer 200", add -- , --.

Col. 4, line 6, after "thin", change "p" to -- P --.

Col. 4, line 7, after "thicker", change "p+" to -- P+ --.

Col. 4, line 7, after "alternatively,", change "n/n+" to -- N/N+ --.

Col. 4, line 12, before "which", change "in" to -- on --.

Col. 4, line 20, after "width", change "W0" to -- $W_0$ --.

Col. 4, line 24, after "*Electronic Devices*", change "$5^{th}$" to -- $5^{th}$ --.

Col. 4, line 25, after "potential", change "$V_o$" to -- $V_0$ --.

Col. 4, line 25, after "across a", change "pn" to -- PN --.

Col. 4, line 33, after "where", change "$\epsilon_o$" to -- $\varepsilon_o$ --.

Col. 4, line 35, after "field", change "$\epsilon_c$" to -- $\varepsilon_c$ --.

Col. 4, line 43, after "*Devices*", add -- , --.

Col. 4, replace the equation printed between lines 45 and 50 with the following:

$$W_0 = \left[ \frac{2 \in V_0}{q} \left( \frac{1}{N_a} + \frac{1}{N_d} \right) \right]^{\frac{1}{2}}$$

Col. 4, replace the equation printed between lines 62 and 65 with the following:

$$V_B = \frac{\in \varepsilon_c^2}{2q} \left( \frac{N_a + N_d}{N_a N_d} \right)$$

Col. 5, line 2, after "then", change "VB" to -- $V_B$ --.

Col. 5, replace the equation printed between lines 4 and 9 with the following:

$$V_B \approx \frac{\in \varepsilon_c^2}{2q} (N_d)^{-1}$$

Col. 5, line 10, before "junction", change "pn" to -- PN --.

Col. 5, line 53, after "and an", change "Epi" to -- EPI --.

Col. 5, line 55, after "200" change "um" to -- μm --.

Col. 5, line 56, before "conductivity", change "n-type" to -- N-type --.

Col. 5, line 63, before "and underwent", change "$5.0 \times 10^4$" to -- $5.0 \times 10^{14}$ --.

Col. 6, line 5, after "both the", change "Epi" to -- EPI --.

Col. 6, line 9, before "Simulations", change "A/um." to -- A/μm --.

CERTIFICATE OF CORRECTION (continued)
U.S. Pat. No. 7,560,355 B2

Claim 9, Col. 6, line 55, before "method", change "he" to -- The --.

Signed and Sealed this

Nineteenth Day of January, 2010

David J. Kappos
*Director of the United States Patent and Trademark Office*